(12) United States Patent
Chung et al.

(10) Patent No.: US 9,000,440 B2
(45) Date of Patent: Apr. 7, 2015

(54) THIN FILM TRANSISTOR, METHOD OF MANUFACTURING THIN FILM TRANSISTOR, AND ORGANIC LIGHT EMITTING DIODE DISPLAY

(75) Inventors: Yun-Mo Chung, Yongin (KR);
Jin-Wook Seo, Yongin (KR);
Tak-Young Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/449,403

(22) Filed: Apr. 18, 2012

(65) Prior Publication Data

US 2012/0299007 A1 Nov. 29, 2012

(30) Foreign Application Priority Data

May 26, 2011 (KR) .......................... 10-2011-0050153

(51) Int. Cl.
| | | |
|---|---|---|
| *H01L 27/14* | (2006.01) | |
| *H01L 29/66* | (2006.01) | |
| *H01L 27/12* | (2006.01) | |
| *H01L 27/32* | (2006.01) | |

(52) U.S. Cl.
CPC ...... *H01L 29/66757* (2013.01); *H01L 27/1277* (2013.01); *H01L 27/3262* (2013.01)

(58) Field of Classification Search
USPC ............... 257/59, 66, 72, E21.413, E27.111, 257/E29.278, E29.293; 438/149, 151, 166, 438/482, 488
See application file for complete search history.

(56) References Cited

U.S. PATENT DOCUMENTS

| | | | | |
|---|---|---|---|---|
| 6,589,836 B1* | 7/2003 | Wang et al. | ................... | 438/231 |
| 7,683,373 B2* | 3/2010 | Park et al. | ........................ | 257/66 |
| 8,013,325 B2* | 9/2011 | Huh et al. | ....................... | 257/40 |
| 8,203,264 B2* | 6/2012 | Kang et al. | .................... | 313/505 |
| 8,283,668 B2* | 10/2012 | Park | .............................. | 257/59 |
| 8,384,087 B2* | 2/2013 | Son et al. | ......................... | 257/72 |
| 2005/0082533 A1* | 4/2005 | Abe | ................ | 257/72 |
| 2006/0073648 A1* | 4/2006 | Park et al. | ..................... | 438/166 |
| 2007/0284581 A1* | 12/2007 | Yang et al. | ...................... | 257/66 |
| 2008/0116461 A1* | 5/2008 | Wu et al. | ......................... | 257/66 |
| 2008/0246033 A1* | 10/2008 | Huh et al. | ....................... | 257/59 |
| 2008/0296565 A1* | 12/2008 | Park et al. | ...................... | 257/40 |
| 2009/0050893 A1* | 2/2009 | Park | ............................... | 257/72 |

(Continued)

FOREIGN PATENT DOCUMENTS

| | | |
|---|---|---|
| JP | 2005-167056 | 6/2005 |
| KR | 10-0473996 | 3/2005 |
| KR | 10-0770268 B1 | 10/2007 |

OTHER PUBLICATIONS

Olea et al., "Titanium doped silicon layers with very high concentration", Journal of Applied Physics 104, 016105 (2008).*

*Primary Examiner* — Marvin Payen
*Assistant Examiner* — Victor Barzykin
(74) *Attorney, Agent, or Firm* — Lee & Morse, P.C.

(57) ABSTRACT

There is provided a thin film transistor including an active layer on a substrate (the active layer including polysilicon and a metal catalyst dispersed in the polysilicon, a source area, a drain area, and a channel area), a gate electrode disposed on the channel area of the active layer, a source electrode electrically connected to the source area, and a drain electrode electrically connected to the drain area, wherein the gate electrode, the source area, and the drain area of the active layer include metal ions, the source area and the drain area are separate from each other, and the channel is disposed between the source area and the drain area.

8 Claims, 7 Drawing Sheets

(56) References Cited

U.S. PATENT DOCUMENTS

| | | | |
|---|---|---|---|
| 2009/0124064 A1* | 5/2009 | England et al. | 438/486 |
| 2010/0155736 A1* | 6/2010 | Yoon et al. | 257/72 |
| 2010/0224883 A1* | 9/2010 | Park et al. | 257/72 |
| 2011/0114963 A1* | 5/2011 | Son et al. | 257/72 |
| 2011/0248277 A1* | 10/2011 | Lee et al. | 257/66 |
| 2011/0253987 A1* | 10/2011 | Chung et al. | 257/40 |
| 2011/0300674 A1* | 12/2011 | Chung et al. | 438/151 |

* cited by examiner

THIN FILM TRANSISTOR, METHOD OF MANUFACTURING THIN FILM TRANSISTOR, AND ORGANIC LIGHT EMITTING DIODE DISPLAY

RELATED APPLICATIONS

This application claims priority to and the benefit of Korean Patent Application No. 10-2011-0050153 filed in the Korean Intellectual Property Office on May 26, 2011, the entire contents of which are incorporated herein by reference.

BACKGROUND

1. Field

The described technology relates generally to a thin film transistor and an organic light emitting diode (OLED) display.

2. Description of the Related Art

Display devices display images, and recently, an organic light emitting diode display has been in the spotlight.

The organic light emitting diode display has a self-emitting characteristic and does not need a separate light source unlike a liquid crystal display. As such, the thickness and weight of the organic light emitting diode are decreased.

A conventional organic light emitting diode (OLED) display includes a thin film transistor formed in each pixel and an organic light emitting element connected with the thin film transistor.

The thin film transistor includes an active layer having a semiconductor characteristic, and a technology for forming an active layer by forming a polysilicon layer from the amorphous silicon layer using diffusion of metal catalysts has been recently developed.

The above information disclosed in this Background section is only for enhancement of understanding of the background of the described technology and therefore it may contain information that does not form the prior art that is already known in this country to a person of ordinary skill in the art.

SUMMARY

One or more embodiments may provide a thin film transistor including an active layer on a substrate, the active layer including polysilicon and a metal catalyst dispersed in the polysilicon, a source area, a drain area, and a channel area, a gate electrode disposed on the channel area of the active layer; a source electrode electrically connected to the source area, and a drain electrode electrically connected to the drain area, wherein the gate electrode, the source area, and the drain area of the active layer include metal ions, the source area and the drain area are separate from each other, and the channel area is disposed between the source area and the drain area.

The amount of metal catalyst in the channel area may be less than the amount of metal catalyst in the source and drain areas.

The metal catalyst may include at least one of nickel (Ni), aluminum (Al), palladium (Pd), titanium (Ti), silver (Ag), gold (Au), tin (Sn), antimony (Sb), copper (Cu), cobalt (Co), molybdenum (Mo), terbium (Tb), ruthenium (Ru), cadmium (Cd), and platinum (Pt). The metal catalyst may include nickel (Ni).

The metal ions may include at least one of titanium (Ti) and molybdenum (Mo).

One or more embodiments may provide an OLED display including a substrate, the thin film transistor (described above) disposed on the substrate, and an organic light emitting element including a first electrode electrically connected to the drain electrode, an organic emission layer disposed on the first electrode, and a second electrode disposed on the organic emission layer. The amount of metal catalyst in the channel area of the thin film transistor may be less than the amount of metal catalyst in the source and drain areas.

The metal catalyst of the thin film transistor may include nickel. The metal ions of the gate electrode, the source area, and the drain area of the thin film transistor may include at least one of titanium (Ti) and molybdenum (Mo).

One or more embodiments may provide a manufacturing method of a thin film transistor, including forming an amorphous silicon layer on a substrate, dispersing a metal catalyst into the amorphous silicon layer, crystallizing the amorphous silicon layer to a polysilicon layer by diffusing the metal catalyst into the amorphous silicon layer through heat treatment of the amorphous silicon layer, forming an active layer, including a source area, a drain area, and a channel area by patterning the polysilicon layer, wherein the source area and the drain area are separate from each other and the channel area is disposed between the source area and the drain area, forming an island-type gate electrode on the channel area of the active layer, injecting metal ions into the source area and the drain area of the active layer using the gate electrode as a mask, and moving the metal catalyst diffused to the channel area to the source area and the drain area by thermally treating the active layer.

The metal catalyst may include nickel (Ni). The metal ions may include at least one of titanium (Ti) and molybdenum (Mo).

DETAILED DESCRIPTION

Figure 1:
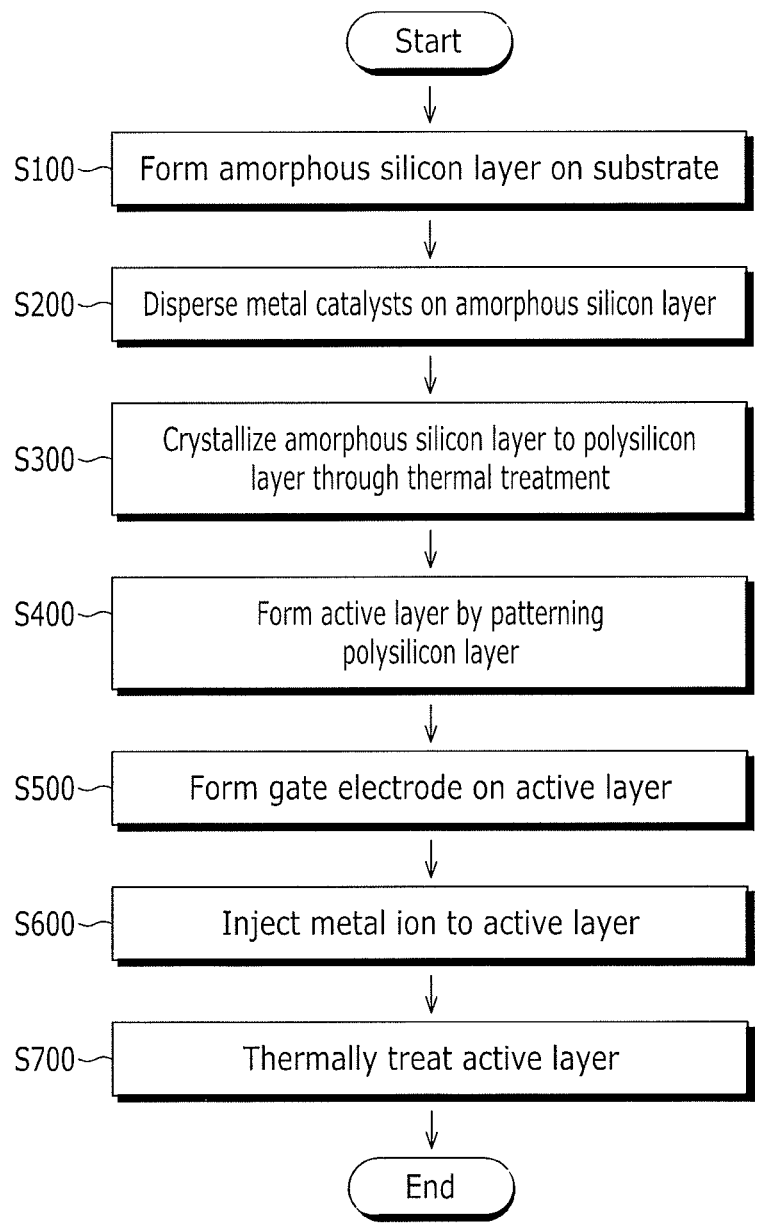
FIG. 1 illustrates a flowchart of a manufacturing method of a thin film transistor according to a first exemplary embodiment.

In the following detailed description, only certain exemplary embodiments have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification.

In various exemplary embodiments, the same reference numerals are used for the elements having the same configuration and will be representatively described in a first exemplary embodiment, and in other exemplary embodiments, only elements different from those of the first exemplary embodiment will be described.

In addition, the size and thickness of each component shown in the drawings are arbitrarily shown for understanding and ease of description, but embodiments are not limited thereto.

In the drawings, the thickness of layers, films, panels, regions, etc., are exaggerated for clarity. In the drawings, for understanding and ease of description, the thicknesses of some layers and areas are exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, throughout the specification, "on" implies being positioned above or below a target element and does not imply being necessarily positioned on the top on the basis of a gravity direction.

Hereinafter, a manufacturing method of a thin film transistor according to a first exemplary embodiment will be described with reference to FIG. 1 to FIG. 8.

FIG. 1 illustrates a flowchart of a manufacturing method of a thin film transistor according to the first exemplary embodiment.

FIG. 2 to FIG. 7 illustrate stages in the method of manufacturing the thin film transistor according to the first exemplary embodiment.

Figure 2:
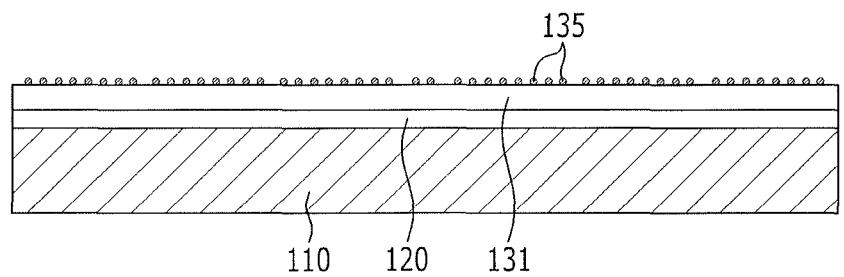
FIG. 2 to FIG. 7 illustrate stages in the method of manufacturing the thin film transistor according to the first exemplary embodiment.

First, as shown in FIG. 1 and FIG. 2, an amorphous silicon layer 131 may be formed on a substrate 110 (S100).

In further detail, a buffer layer 120 may be formed on the insulating substrate 110 and the amorphous silicon layer 131 may be formed on the buffer layer 120.

Next, a metal catalyst 135 may be dispersed on the amorphous silicon layer 131 (S200).

In further detail, the metal catalyst 135 may be sprayed such that particles thereof are separated from each other by a predetermined distance on the amorphous silicon layer 131. The metal catalyst 135 may be disposed at a concentration of $10^{12}/cm^2$ to $10^{14}/cm^2$ on the amorphous silicon layer 131. The metal catalyst 135 may include at least one of nickel (Ni), aluminum (Al), palladium (Pd), titanium (Ti), silver (Ag), gold (Au), tin (Sn), antimony (Sb), copper (Cu), cobalt (Co), molybdenum (Mo), terbium (Tb), ruthenium (Ru), cadmium (Cd), and platinum (Pt). Preferably, nickel (Ni) may be used as the metal catalyst 135. The metal catalyst 135 may be placed on the amorphous silicon layer 131 at molecular level.

Figure 3:
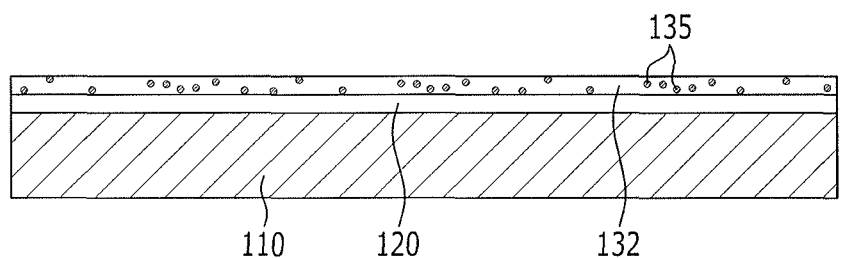

Next, as shown in FIG. 3, a polysilicon layer 132 may be crystallized by performing heat treatment on the amorphous silicon layer 131 (S300).

In further detail, the amorphous silicon layer 131 may be thermally treated. The heat treatment of the amorphous silicon layer 131 may be performed at a temperature between 300° C. and 700° C. for 10 minutes to 20 hours. When the amorphous silicon layer 131 is thermally treated, the metal catalyst 135 dispersed on the amorphous silicon layer 131 may be diffused into the amorphous silicon layer 131. When nickel (Ni) is used as the metal catalyst 135, the metal catalyst 135 may be diffused into the amorphous silicon layer 131. Thus, nickel (Ni) of the metal catalyst 135 and silicon (Si) of the amorphous silicon layer 131 may be combined such that nickel disilicide ($NiSi^2$) is formed in the amorphous silicon layer 131. The nickel disilicide ($NiSi^2$) formed in the amorphous silicon layer 131 may become a seed. Crystals may be grown in the amorphous layer 131 around the seed such that the amorphous silicon layer 131 is crystallized to the polysilicon layer 132. At least some particles of the metal catalyst 135 in the polysilicon layer 132 may not be involved in the crystallization.

Figure 4:
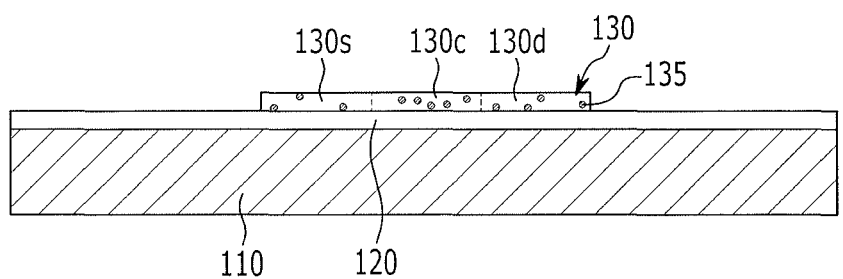

Next, as shown in FIG. 4, an active layer 130 may be formed by patterning the polysilicon layer 132 (S400).

In further detail, the polysilicon layer 132 may be patterned using microelectromechanical systems (MEMS) technology such as a photolithography process to form the active layer 130, including a source area 130s to which a source electrode is connected, a drain area 130d to which a drain electrode is connected, and a channel area 130c disposed between the source area 130s and the drain area 130d.

Figure 5:
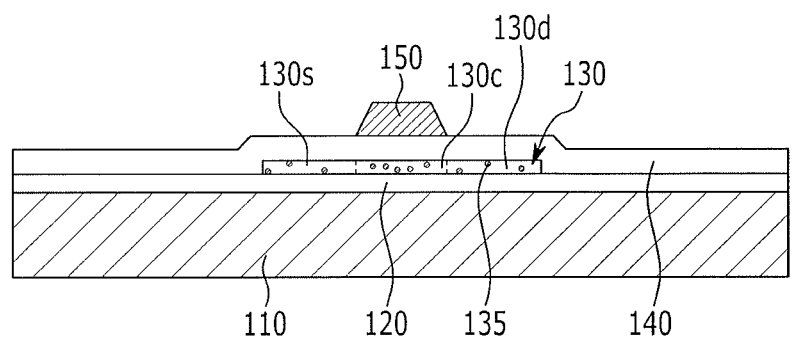

Next, as shown in FIG. 5, a gate electrode 150 may be formed on the active layer 130 (S500).

In further detail, after a gate insulating layer 140 may be formed on the active layer 130 and a gate metal layer may be formed on the gate insulating layer 140, the gate metal layer may be patterned using the MEMS technology such as the photolithography process to form an island-shaped gate electrode 150 on the channel area 130c of the active layer 130.

Figure 6:
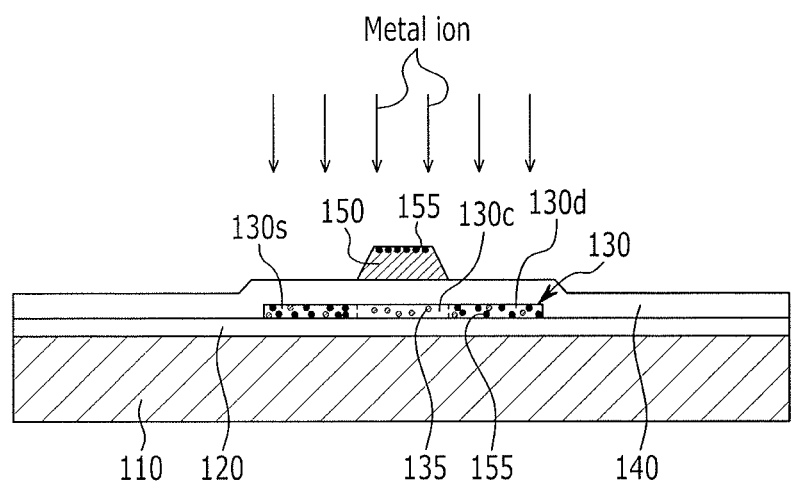

Next, as shown in FIG. 6, metal ions 155 may be injected into the active layer 130 (S600).

In further detail, at least one of titanium (Ti) and molybdenum (Mo) (rather than a well-known impurity such as boron (B) or phosphorus (P)) may be injected as the metal ions 155 into the active layer 130 using the gate electrode 150 as a mask. In this case, since the gate electrode 150 is used as a mask, the metal ions 155 may be injected into the gate electrode 150, the source area 130s, and the drain area 130d of the active layer 130. Due to the injection of the metal ions 155, at least one of titanium silicide (TiSi) and molybdenum silicide (MoSi) may be formed in the channel area 130c and the drain area 130d of the active layer 130 such that the channel area 130c of the active layer 130 becomes an intrinsic semiconductor and the source area 130a and the drain area 130d of the active layer 130 become impurity semiconductors where at least one of titanium silicide (TiSi) and molybdenum silicide (MoSi) may be formed.

Figure 7:
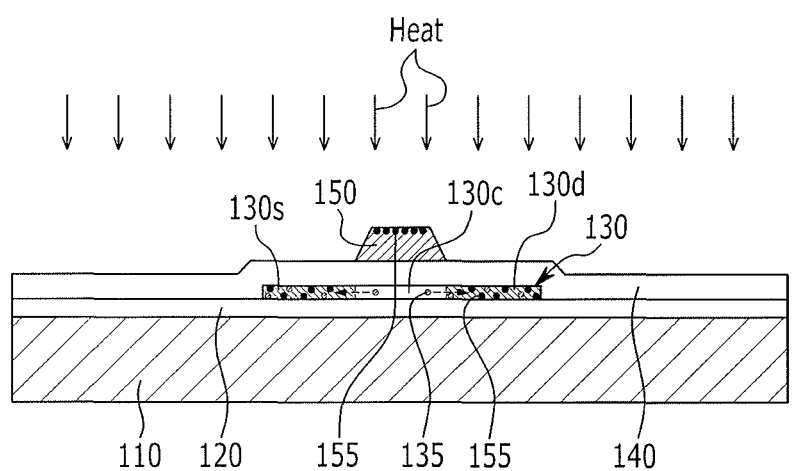

Next, as shown in FIG. 7, the active layer 130 may be thermally treated (S700).

In further detail, the heat treatment may be performed on the active layer 130 at a temperature between 400° C. and 800° C. for 10 minutes to 20 hours. When the active layer 130 is thermally treated, the source area 130s and the drain area 130d of the active layer 130 may be wholly phase-charged to at least one of titanium silicide (TiSi) and molybdenum silicide (MoSi). The metal catalyst 135 existing in the channel area 130c of the active layer 130 may be diffused to the source area 130s and the drain area 130d that are thermodynamically stable compared to the channel area 130c (refer to the dotted line direction of FIG. 7). Thus, when nickel (Ni) is used as the metal catalyst 135 and titanium (Ti) is used as the metal ions 155, titanium nickel silicide (TiNiSi) or nickel silicide (Nisi) may be formed in the source area 130s and the drain area 130d of the active layer 130 due to the nickel (Ni) being diffused from the channel area 130s. The concentration of nickel (Ni) that is the metal catalyst 135 that is involved or not involved in the crystallization of the active layer 130 may be decreased.

As described, as the concentration of the metal catalyst 135 in the channel area 130c of the active layer 130 is decreased, no undesirable leakage current flows to the drain area 130d from the source area 130s through the channel area 130c so that deterioration of the semiconductor characteristic of the active layer 130 may be minimized.

Figure 8:
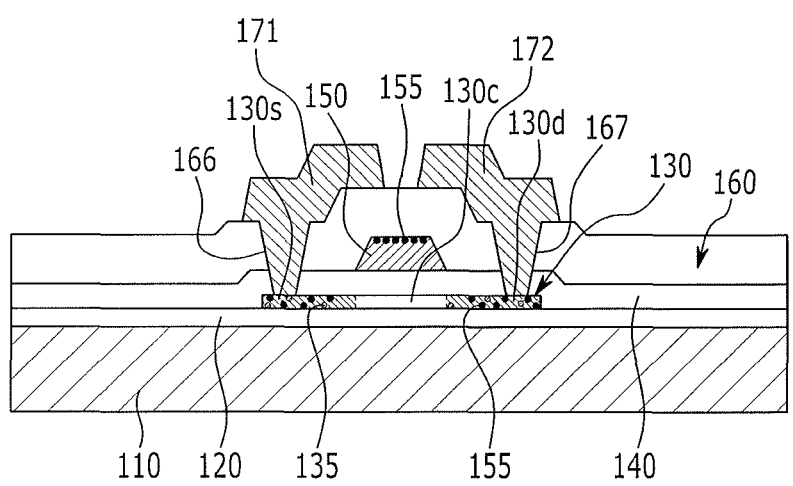
FIG. 8 illustrates a thin film transistor according to a second exemplary embodiment.

Next, as shown in FIG. 8, a source electrode 171 and a drain electrode 172 that are connected to the active layer 130 may be formed.

In further detail, an interlayer insulating layer 160 may be formed on the gate electrode 150, a first contact hole 166 and a second contact hole 167 that respectively expose a part of the source area 130s and a part of the drain area 130d of the active layer 130 may be formed by patterning the interlayer insulating layer 160 and the gate insulating layer 140 together using the MEMS technology such as a photolithography process. Then, the source electrode 171 and the second drain electrode 172 that contact the source area 130s and the drain area 130d, respectively, of the active layer 130 through the first contact hole 166 and the second contact hole 167 may be formed on the interlayer insulating layer 160.

A thin film transistor according to a second exemplary embodiment may be formed using the manufacturing method of the thin film transistor, according to the first exemplary embodiment.

As described above, according to the manufacturing method of the thin film transistor of the first exemplary embodiment, the metal ions 155, including at least one of titanium (Ti) and molybdenum (Mo) may be injected into the source area 130s and the drain area 130d of the active layer 130 to diffuse the metal catalyst 135 remaining in the channel area 130c into the source area 130s and the drain area 130d through heat treatment. Consequently, the concentration of the metal catalyst 135 in the channel area 130c and flow of an undesirable leakage current to the drain area 130d from the source area 130s through the channel area 130c, may be minimized.

Hereafter, the thin film transistor according to the second exemplary embodiment will be described with reference to FIG. 8.

FIG. 8 illustrates the thin film transistor according to the second exemplary embodiment.

As shown in FIG. 8, the thin film transistor according to the second exemplary embodiment may be formed by the same manufacturing method used to manufacture the thin film transistor according to the first exemplary embodiment.

In the thin film transistor according to the second exemplary embodiment, metal ions 155, including at least one of titanium (Ti) and molybdenum (Mo), may be injected into a source area 130s and a drain area 130d of an active layer 130 using a gate electrode 150 as a mask so that the metal ions 155, including at least one of titanium (Ti) and molybdenum (Mo), may be injected into the gate electrode 150 and the source area 130s and drain area 130d of the active layer 130. Thus, the metal catalyst 135 remaining in a channel area 130c of the active layer 130 may be diffused to the source area 130s and the drain area 130d such that the concentration of the metal catalyst 135 in the channel area 130c may be decreased. Accordingly, flow of an undesirable leakage current to the drain area 130d from the source area 130s through the channel area 130c may be minimized so that deterioration of a semiconductor characteristic of the active layer 130 may be minimized.

Hereinafter, an experiment performed to determine a characteristic of the thin film transistor according to the second exemplary embodiment will be described with reference to FIG. 9 and FIG. 10.

Figure 9:
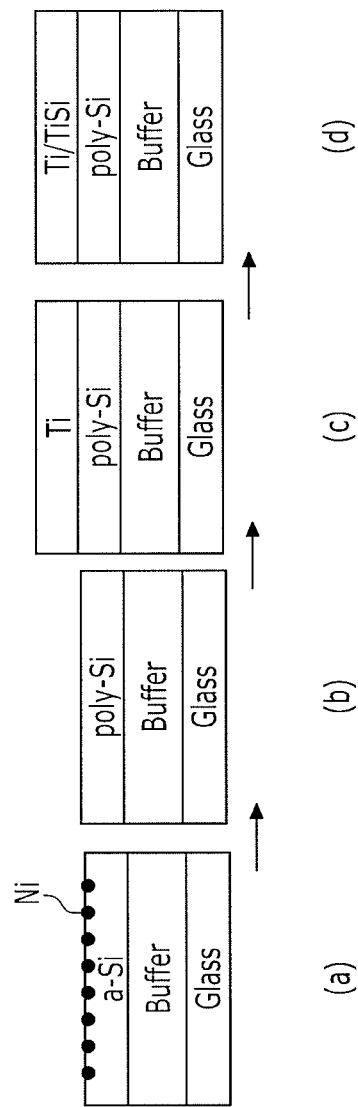
FIG. 9 illustrates steps in an experiment to determine a characteristic of the thin film transistor according to the second exemplary embodiment.
Figure 10:
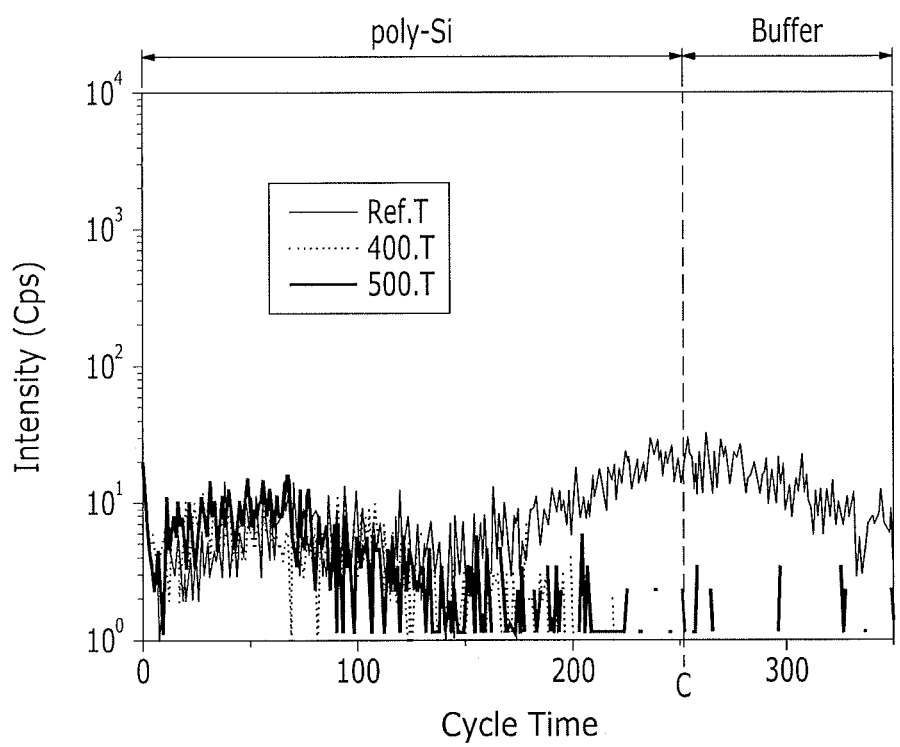
FIG. 10 illustrates a graph derived from results of the experiment performed to determine the characteristic of the thin film transistor according to the second exemplary embodiment.

FIG. 9 illustrates a flowchart of an experiment performed to determine a characteristic of the thin film transistor according to the second exemplary embodiment. FIG. 10 illustrates a graph derived from results of the experiment performed to determine the characteristic of the thin film transistor according to the second exemplary embodiment. In the graph of FIG. 10, the x-axis denotes a cycle time of sequential digging of the surface of the polysilicon (poly-Si) layer identified in FIG. 9, and the y-axis denotes the intensity of diffracted X-ray, which is proportional to the concentration of nickel (Ni) within the polysilicon (poly-Si) layer.

As shown in (a) of FIG. 9, a buffer layer and an amorphous silicon (a-Si) layer were layered on glass, and then nickel (Ni) was dispersed on the amorphous silicon (a-Si) layer. Next, as shown in (b), the glass was thermally treated to form a polysilicon (poly-Si) layer from the amorphous silicon (a-Si) layer. In this case, the concentration of nickel (Ni) in the polysilicon (poly-Si) layer was determined. The concentration of nickel (Ni) in the polysilicon (poly-Si) layer in this step is referred to as "Ref.T" in FIG. 10. As shown in FIG. 10, "Ref.T" (concentration of nickel (Ni)) was the highest at the dashed line C. The dashed line C was determined to be an interface between the polysilicon (poly-Si) layer and the buffer layer.

Referring to FIG. 9, a titanium (Ti) layer was layered on the polysilicon (poly-Si) layer as shown in step (c). Then, as shown in step (d), the glass was thermally treated at a temperature of 400° C. or 500° C. such that a titanium/titanium silicide (Ti/TiSi) layer was foamed from the titanium (Ti) layer and nickel (Ni) remaining in the polysilicon (poly-Si) layer was diffused to the titanium silicide (TiSi) layer so that the concentration of nickel (Ni) in the polysilicon (poly-Si) layer was decreased. The concentration of nickel (Ni) in the polysilicon (poly-Si) layer was determined. The concentration in the polysilicon layer (poly-Si) in this step is referred to as "400.T" (thermally treated at 400° C.) and "500.T" (thermally treated at 500° C.) of FIG. 10. As shown in FIG. 10, it was determined that 400.T and 500.T (the concentration of nickel (Ni) in the polysilicon (poly-Si) layer in this step) were less than Ref.T.

As a result of the experiment, it was determined that nickel (Ni) in the polysilicon (poly-Si) layer was diffused into the titanium (Ti) layer so that the concentration of nickel (Ni) in the polysilicon (poly-Si) layer was decreased.

Hereinafter, an organic light emitting diode (OLED) display according to a third exemplary embodiment will be described with reference to FIG. 11.

Figure 11:
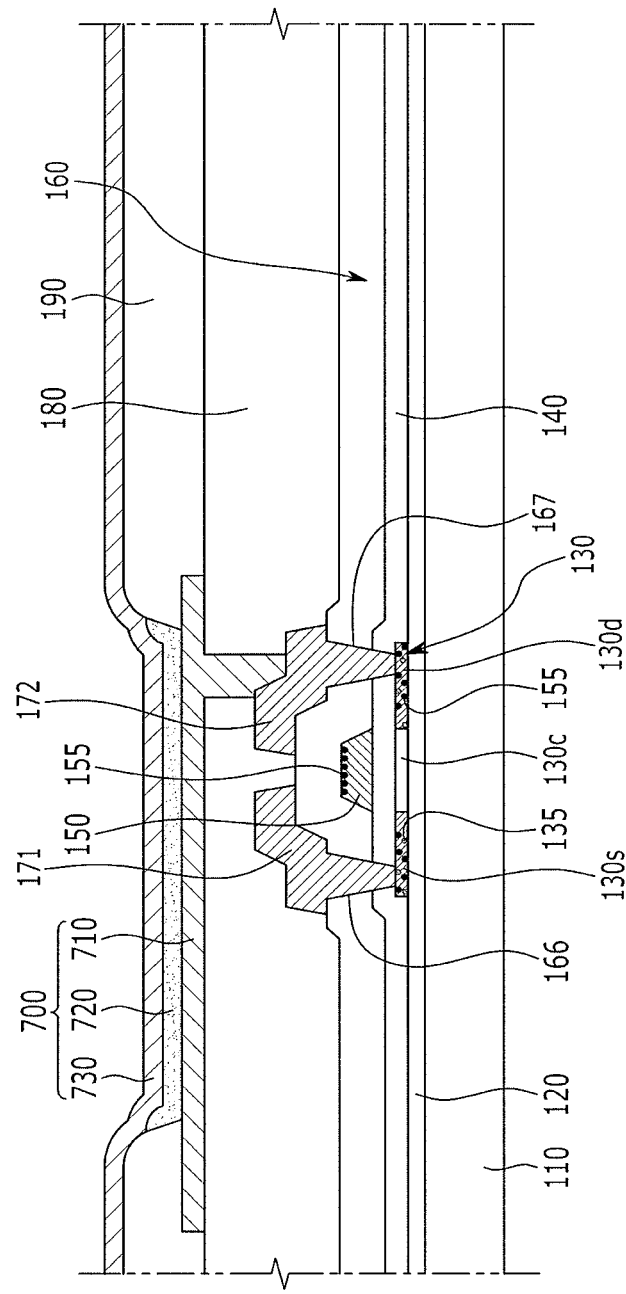
FIG. 11 illustrates an organic light emitting diode (OLED) display according to a third exemplary embodiment.

FIG. 11 illustrates an OLED display according to the third exemplary embodiment.

As shown in FIG. 11, the OLED display according to the third exemplary embodiment may include the thin film transistor of the second exemplary embodiment, and may further include a planarization layer 180 disposed on the source electrode 171 and the drain electrode 172, a pixel defining layer 190 disposed on the planarization layer 180 to define a pixel, and an organic light emitting element 700 disposed in a position corresponding to the position of the pixel defining layer 190 (i.e., adjacent to the pixel defining layer 190). The organic light emitting element 700 may include a first electrode 710 connected with the drain electrode 172, a second electrode 730 disposed on the first electrode 710, and an organic emission layer 720 disposed between the first electrode 710 and the second electrode 730.

As described above, in the OLED display according to the third exemplary embodiment, the active layer 130 forming the thin film transistor may be crystallized through the metal catalyst 135 so that electron mobility of the channel area 130c of the active layer 130 may be increased and a semiconductor characteristic of the thin film transistor may, thereby, be improved. Thus, display quality of the OLED display including the thin film transistor may be improved.

In addition, in the OLED display, according to the third exemplary embodiment, the active layer 130 forming the thin film transistor may be crystallized by using the metal catalyst 135, but the metal catalyst remaining in the channel area 130c of the active layer may be diffused into the source area 130s and the drain area 130d where the metal ions are injected. Thus, the concentration of the metal catalysts 135 in the channel area 130c may be decreased, and an undesirable leakage current may be suppressed from flowing to the drain area 130d from the source area 130s through the channel area 130c. In other words, deterioration of the semiconductor characteristic of the thin film transistor may be minimized so that deterioration of the display quality of the OLED display including the thin film transistor may be minimized.

Conventional organic light emitting diode display has high-grade characteristics such as low power consumption, high luminance, high reaction speed, and the like. However, when the polysilicon layer of a thin film transistor of a conventional organic light emitting diode is formed from the amorphous silicon layer using the diffusion of metal catalysts, the metal catalysts remain in the polysilicon layer so that a semiconductor characteristic of the active layer formed of the polysilicon layer may be deteriorated.

In contrast, the described technology has been made in an effort to provide a thin film transistor that can minimize deterioration of a semiconductor characteristic of an active layer formed of a polycrystalline semiconductor layer even through the polycrystalline semiconductor layer is formed using diffusion of a metal catalyst, a manufacturing method of a thin film transistor, and an organic light emitting diode (OLED) display.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor, comprising:
    an active layer on a substrate, the active layer including:
        polysilicon and a metal catalyst dispersed in the polysilicon,
        a source area,
        a drain area, and
        a channel area;
    a gate electrode disposed on the channel area of the active layer;
    a source electrode electrically connected to the source area; and
    a drain electrode electrically connected to the drain area, wherein:
    the source area and the drain area are impurity-doped semiconductors doped with impurity dopants, the impurity dopants being metal ions consisting of molybdenum and/or titanium, and the gate electrode, and the source area, and the drain area of the active layer include the metal ions,
    the source area and the drain area are separate from each other,
    the channel area is disposed between the source area and the drain area, and
    the amount of metal catalyst in the channel area is less than the amount of metal catalyst in the source and drain areas.

2. The thin film transistor of claim 1, wherein the metal catalyst includes at least one of nickel (Ni), aluminum (Al), palladium (Pd), titanium (Ti), silver (Ag), gold (Au), tin (Sn), antimony (Sb), copper (Cu), cobalt (Co), molybdenum (Mo), terbium (Tb), ruthenium (Ru), cadmium (Cd), and platinum (Pt).

3. The thin film transistor of claim 1, wherein the metal catalyst includes nickel (Ni).

4. An organic light emitting diode (OLED) display, including:
    a substrate;
    the thin film transistor of claim 1 disposed on the substrate; and
    an organic light emitting element, including a first electrode electrically connected to the drain electrode, an organic emission layer disposed on the first electrode, and a second electrode disposed on the organic emission layer.

5. The organic light emitting diode (OLED) display of claim 4, wherein the metal catalyst of the thin film transistor includes at least one of nickel (Ni), aluminum (Al), palladium (Pd), titanium (Ti), silver (Ag), gold (Au), tin (Sn), antimony (Sb), copper (Cu), cobalt (Co), molybdenum (Mo), terbium (Tb), ruthenium (Ru), cadmium (Cd), and platinum (Pt).

6. The organic light emitting diode (OLED) display of claim 4, wherein the metal catalyst of the thin film transistor includes nickel (Ni).

7. A manufacturing method of a thin film transistor, the method comprising:
    forming an amorphous silicon layer on a substrate;
    dispersing a metal catalyst into the amorphous silicon layer;
    crystallizing the amorphous silicon layer to a polysilicon layer by diffusing the metal catalyst into the amorphous silicon layer through heat treatment of the amorphous silicon layer;
    forming an active layer, including a source area, a drain area, and a channel area by patterning the polysilicon layer, wherein the source area and the drain area are separate from each other and the channel area is disposed between the source area and the drain area;
    forming an island-type gate electrode on the channel area of the active layer;
    injecting metal ions consisting of molybdenum and/or titanium into the source area and the drain area of the active layer using the gate electrode as a mask so as to form impurity-doped semiconductors in the source area and the drain area; and
    moving the metal catalyst diffused to the channel area to the source area and the drain area by thermally treating the active layer, wherein the amount of metal catalyst in the channel area is less than the amount of metal catalyst in the source and drain areas.

8. The manufacturing method of the thin film transistor of claim 7, wherein the metal catalyst includes nickel (Ni).

* * * * *